United States Patent [19]

Rolfe

[11] Patent Number: 5,512,932
[45] Date of Patent: Apr. 30, 1996

[54] METHOD AND APPARATUS FOR DRIVING A SEMICONDUCTOR LASER DEVICE

[75] Inventor: Norman F. Rolfe, Carlisle, Mass.

[73] Assignee: Miles Inc., Wilmington, Mass.

[21] Appl. No.: 180,828

[22] Filed: Jan. 12, 1994

[51] Int. Cl.$^6$ .................................................. B41J 15/16
[52] U.S. Cl. ........................... 347/247; 372/29; 372/38
[58] Field of Search .............................. 347/247, 237, 347/148; 372/31, 29, 38

[56] References Cited

U.S. PATENT DOCUMENTS

| | | | |
|---|---|---|---|
| 4,751,524 | 6/1988 | Balchunas | 372/38 |
| 4,899,344 | 2/1990 | Shibata et al. | 372/29 |
| 5,170,403 | 12/1992 | Mayer | 372/38 |

*Primary Examiner*—Mark J. Reinhart
*Attorney, Agent, or Firm*—Richard J. Birch

[57] ABSTRACT

A method and apparatus for driving a semiconductor laser device to produce a substantially constant optical power output over a range of temperature while preserving a high optical switching frequency.

36 Claims, 3 Drawing Sheets

METHOD AND APPARATUS FOR DRIVING A SEMICONDUCTOR LASER DEVICE

FIELD OF THE INVENTION

The invention relates generally to a method and apparatus for current driving a semiconductor laser device for producing an optical signal. Specifically the method and apparatus provide a bias current that produces a low laser power output and a higher current that produces a higher laser power output.

BACKGROUND OF THE INVENTION

Semiconductor laser devices emit light having an optical power output level that is a non-linear function of the current flowing through the device. The transfer function, device current versus optical power output, of semiconductor laser devices is not stable and changes as a function of temperature and age. These devices must be controlled to maintain a desired optical power output level and insure that the electrical power dissipation does not exceed its' rated maximum and destroy the device. These devices are capable of high switching frequencies when maintained in a conducting state by supplying a bias current through the device. The bias current reduces the effective impedance of the device thereby increasing its switching frequency.

Previous circuits lacked in maintaining constant ON state and OFF state currents through the semiconductor laser device. This causes the laser beam to be unstable, optical power output is not at the desired level immediately following the transition from the OFF state to the ON state. This instability causes optical power density variations which introduce noise into the optical output signal.

Another problem with prior circuits is poor ability to adjust and maintain the operating points of the current driver to compensate for variations in the terminal characteristics of the semiconductor laser device due to temperature variations and age.

For example, a driver circuit for a laser diode is described in U.S. Pat. No. 4,761,659, issued on Aug. 2, 1988, to Negishi. This driver circuit compensates for variation of the relationship of laser diode current and laser diode optical power output due to temperature and age. The driver circuit compensates for these variations by using a diode in a reference circuit for controlling the power output of the laser diode. The reference voltage, produced by the reference circuit, varies with temperature in a manner similar to that of the laser diode which tends to maintain the laser diode optical power output reasonably constant. The driver circuit itself however limits high frequency operation since there is no bias current supplied to the laser diode during its' OFF state.

Another example is U.S. Pat. No. 4,709,369, issued on Nov. 24, 1987, to Howard. This patent describes a driver circuit that controls the power output of a laser diode. This driver circuit allows for a bias current through the laser diode for increased frequency of operation. The circuit adjusts the writing current and bias current levels with a single reference. This single reference is optimized to produce the desired power output in the writing state and the bias current is whatever results from the reference voltage through the other emitter resistor. This circuit does not maintain a constant contrast ratio between the ON and OFF states of the laser diode and can cause image shadow on sensitive imaging media as temperature varies.

It is therefore a general object of the invention to control the current flows within a semiconductor laser device to maintain a substantially constant optical power output while maintaining a high switching frequency of the semiconductor laser device.

It is a further object of the invention to automatically adjust the current flows within a semiconductor laser device to compensate for variations in the transfer characteristics of the device due to temperature and age in order to maintain the optical power output and contrast ratio substantially constant while maintaining the ability to switch the semiconductor laser device at a high frequency.

SUMMARY OF THE INVENTION

A method and apparatus for driving a semiconductor laser device that produces a high optical power output state and a low optical power output state in a semiconductor laser device. A bias current for a semiconductor laser device is established that produces a low predetermined optical power output defining its' first state. A higher current that is the sum of the bias current and an information current produces a high predetermined optical power output defining it's second state. The information current is maintained substantially constant via a closed loop control system. The information current is steered through one of two semiconductor laser devices in response to an input information signal.

Both of the bias currents are adjusted, by a calibration circuit, to compensate for changes in temperature to maintain the low predetermined optical power output level of each first state. This provides for a controlled contrast ratio which is substantially constant. The bias currents maintain the semiconductor laser devices in an active state such that a high switching frequency can be realized.

The calibration circuit also insures that the information current has substantially the same value regardless of the semiconductor laser device through which it is steered. This condition results in stable optical power output close to the switching time thereby minimizing noise in the optical signal and maintaining high switching frequency.

BRIEF DESCRIPTION OF THE DRAWINGS

The objects and features set forth above and other objects and features of the invention will best be understood from a detailed description of a preferred embodiment thereof, selected for purposes of illustration and shown in the accompanying drawings in which.

DETAILED DESCRIPTION OF THE INVENTION

The preferred embodiment of the invention is in a laser imaging system wherein a laser beam is used to record an image on a recording media. A semiconductor laser device is used as the imaging element which generates the laser beam. A current generator is used to drive the imaging element with a substantially constant current. Another semiconductor laser device is used as a dummy load for the current generator when it is not driving the imaging element.

This allows the current generator to drive the semiconductor laser devices and maintain the information current substantially constant. A current switch is responsive to an input information signal which is representative of an image to be recorded on a recording media.

Figure 1:
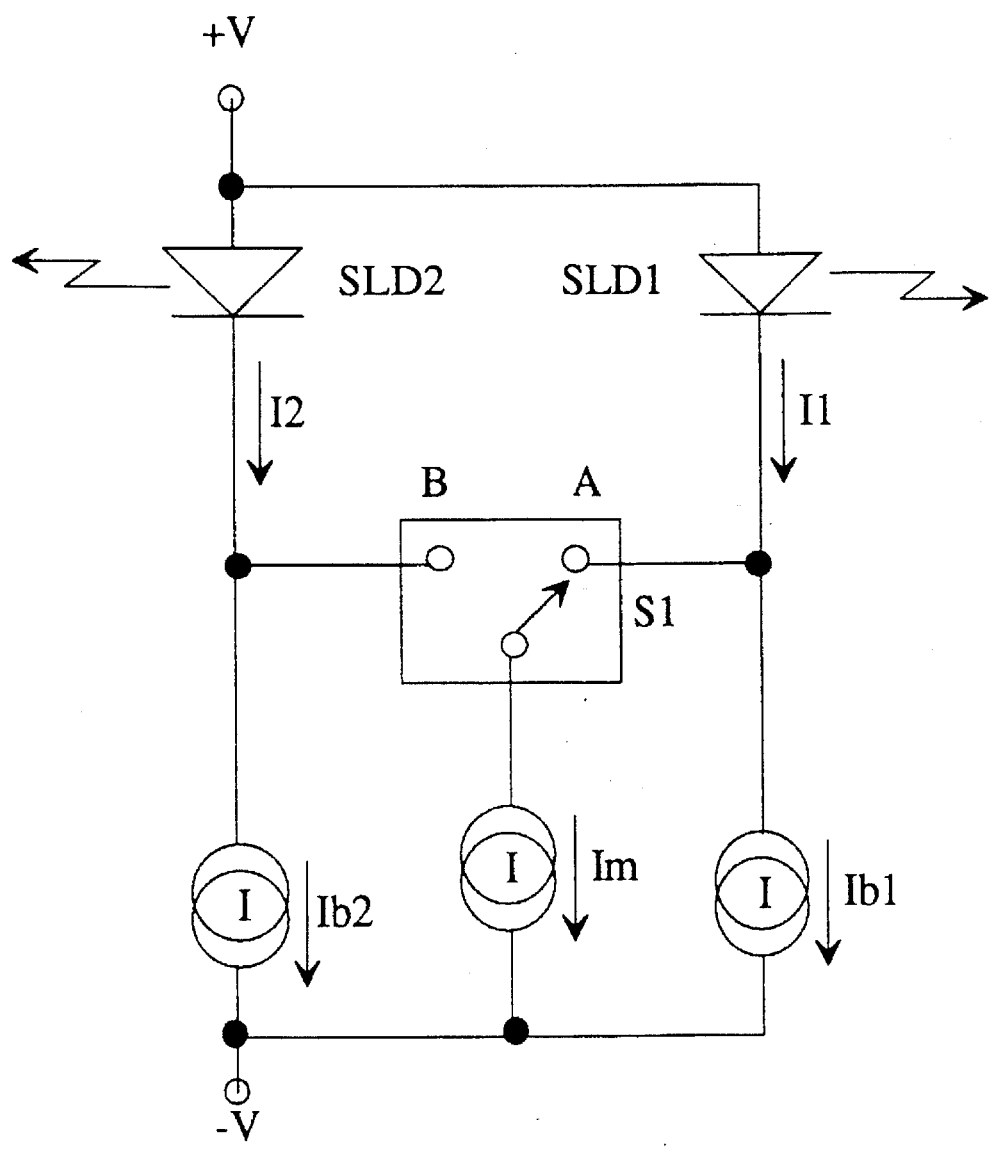
FIG. 1 is a schematic diagram of the basic current steering circuit.

The basic circuit, as shown in FIG. 1, is a differential switch that steers an information current Im between two semiconductor laser devices, SLD1 and SLD2. Each semiconductor laser device is supplied a bias current (Ib1 and Ib2, respectively) to keep them in a conducting state. The values of Ib1 and Ib2 are picked such that the optical power outputs of SLD1 and SLD2 are below the lasing threshold. The existence of the bias currents Ib1 and Ib2 reduces the time required for the semiconductor laser devices to transition between their first state and their second state. When switch S1 is in position A, the information current Im is steered through semiconductor laser device SLD1 such that I1=Ib1+Im and I2=Ib2. This condition causes SLD1 to be in its second state while SLD2 is in its first state. When switch S1 is in position B the current Im is steered through SLD2 such that I2=Ib2+Im and I1=Ib1. This condition causes SLD2 to be in its second state while SLD1 is in its first state. The position of switch S1 changes in response to the state of the input information signal.

Figure 2:
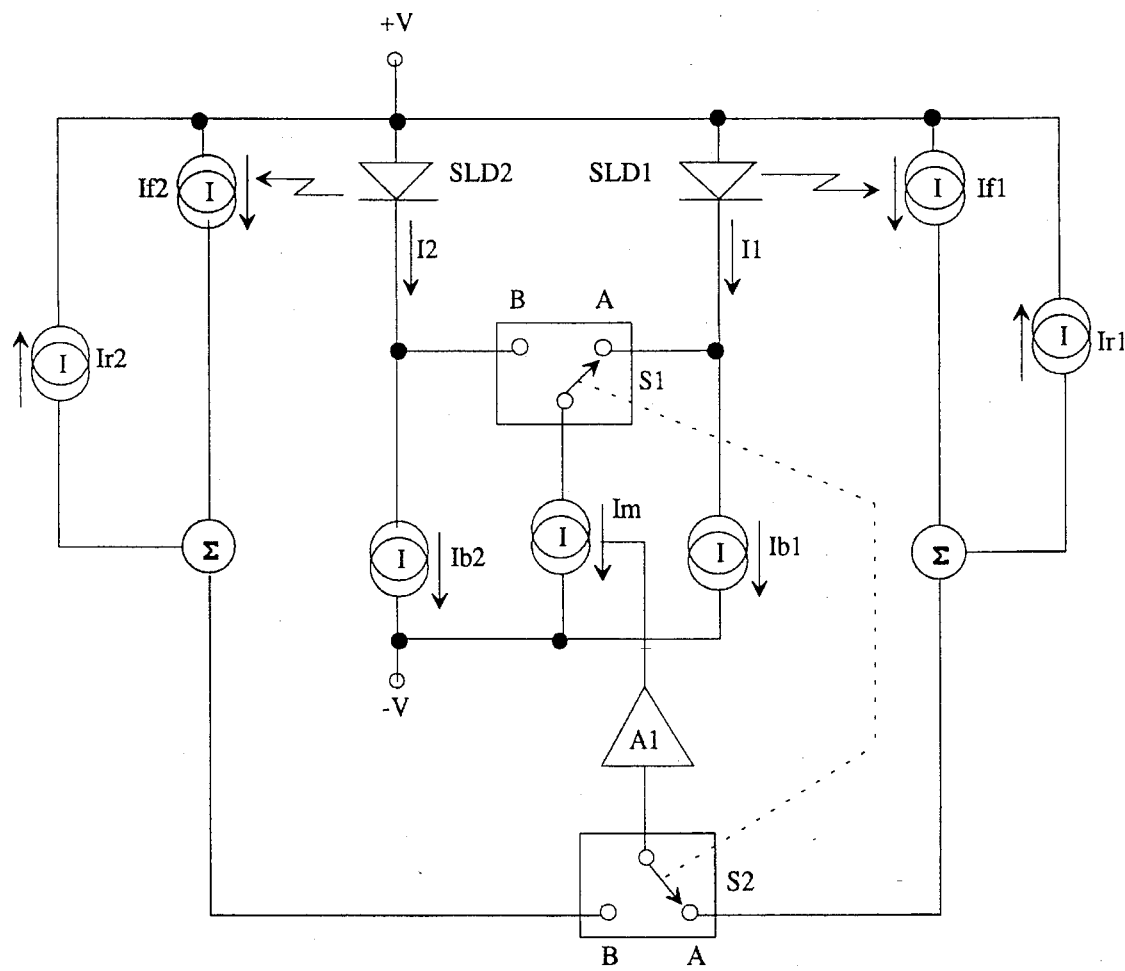
FIG. 2 is a schematic diagram showing the addition of a control mechanism to adjust the information current source.

FIG. 2 shows the addition of a control mechanism to the basic circuit of FIG. 1. This control circuit adjusts the information current Im to produce the high predetermined optical power output defining the second state of semiconductor laser device SLD1. A reference current source Ir1, which has a predetermined value representative of the high predetermined optical power output defining the second state of SLD1, and a current source If1, which is proportional to the optical power output of SLD1 is added to the circuit of FIG. 2. The currents Ir1 and If1 are summed and supplied to an error amplifier A1 via the A position of switch S2. The error amplifier A1 adjusts the value of the current source Im such that Ir1−If1=0 which occurs when the optical power output of SLD1 attains the predetermined value defining it's second state. Switches S1 and S2 are interlocked such that they both change to the same position at the same time in response to the state of the input information signal.

A complementary circuit is added around semiconductor laser device SLD2. This circuit is comprised of a reference current source Ir2 and a current source If2 that is proportional to the optical power output of SLD2. The currents Ir2 and If2 are summed and supplied to the error amplifier A1 via the B position of switch S2. The error amplifier A1 adjusts the value of the current source Im such that Ir2−If2=0, which is the condition that occurs when the optical power output of SLD2 attains the predetermined value of its second state.

The value of the current Ib2 is picked such that the value of the information current Im is the same for both positions A and B of switches S1 and S2. This results in the optical power output of SLD1 being immediately stable after the transition of switches S1 and S2 occurs. This greatly improves the usable switching frequency of the driver circuit.

Figure 3:
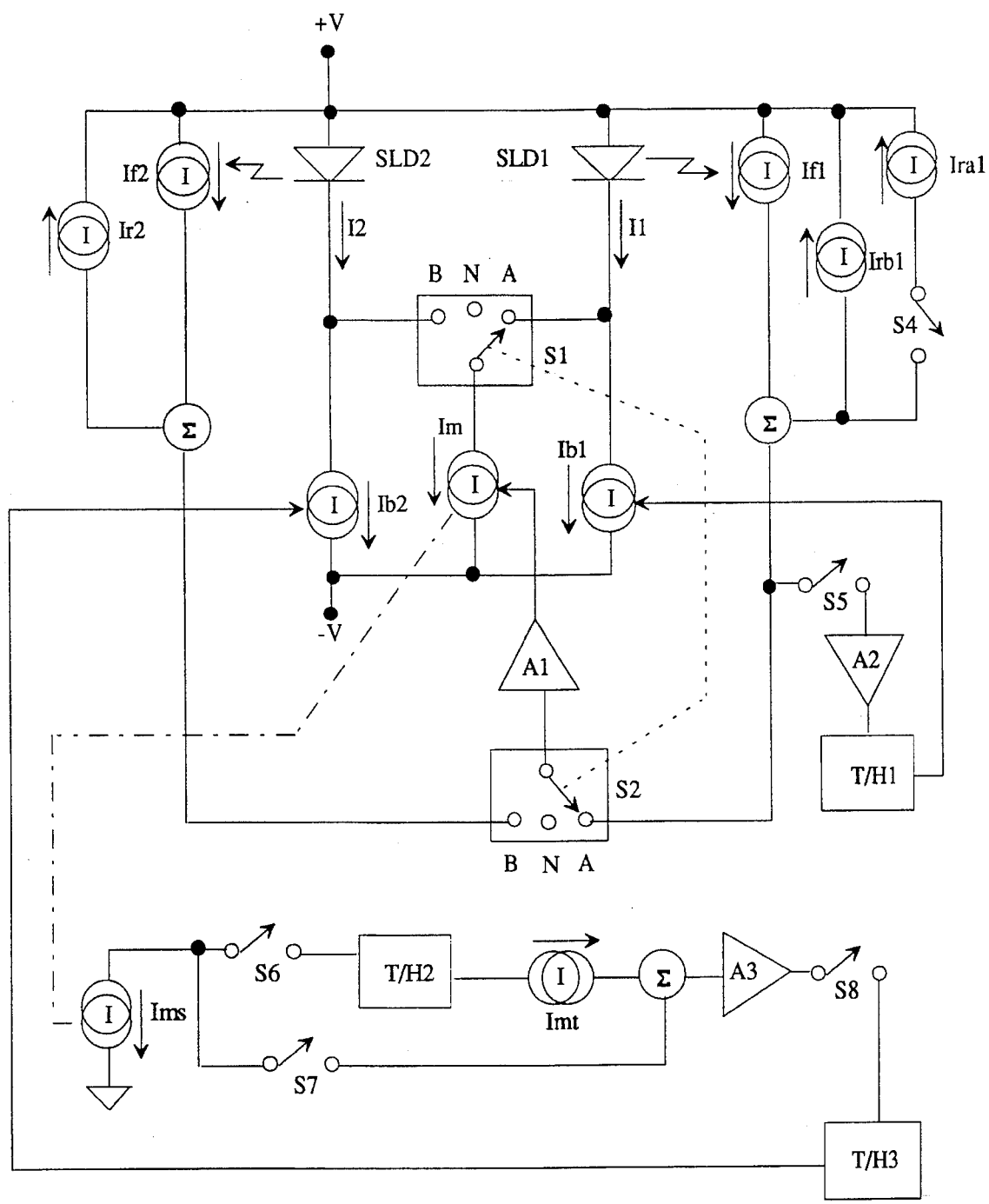
FIG. 3 is a schematic diagram showing the addition of a control mechanism to adjust the bias currents for each of the semiconductor laser devices.

FIG. 3 shows the addition of control circuitry to calibrate, adjust, the bias current sources for SLD1 and SLD2. This allows the driver circuit to compensate for device transfer characteristic variations with temperature and age. The desired result is to maintain the optical power output of SLD1 substantially constant and maintain the value of Im substantially constant whether steered through SLD1 or SLD2.

The circuit of FIG. 3 replaces current source Ir1 (of FIG. 2) with two current sources Ira1 and Irb1. The current sources Ira1 and Irb1 are reference currents for the high predetermined optical power output defining the second state and the low predetermined optical power output defining the first state respectively of device SLD1. An explanation of the calibration process follows.

The bias current Ib1 is adjusted during a time when the optical output of SLD1 is not otherwise used. During this time switches S1 and S2 are in position N, switch S5 is closed, switches S4, S6, S7 and S8 are open, and track and hold circuit T/H1 is in the track mode. The current If1−Irb1 is summed and input to error amplifier A2 via switch S5. The amplified error output of A2 is tracked by track and hold circuit T/H1. The output of T/H1 adjusts the current Ib1 such that If1−Irb1=0 which occurs when SLD1 attains the low predetermined optical power output defining it's first state. Track and hold circuit T/H1 switches from track mode to hold mode at the end of this time and remains in hold mode until the next calibration cycle.

After completing the adjustment of bias current Ib1 the calibration process samples the value of Im when flowing through SLD1. This is done to allow subsequent adjustment of the bias current Ib2 such that Im remains substantially the same value when flowing through SLD2. This sampling is performed during a time following the adjustment of bias current Ib1. Switches S1 and S2 are placed in position A, switches S4, S6 are closed, switches S5, S7, S8 are open and track and hold circuit T/H2 is placed in track mode. A current mirror is used to mirror the value of the information current Im in the Ims current source. The current Ims is tracked by track and hold circuit T/H2. The output of T/H2 is the current source Imt which now has a value equal to that of Ims. The sampling is now complete and T/H2 is placed in hold mode until the next adjustment cycle.

After completing sampling of the value of the information current Im the calibration process adjusts the value of bias current source Ib2. During this time switches S1 and S2 are in position B, switch S5, S6 are opened, switches S4, S7 and S8 are closed, and track and hold circuit T/H3 is placed in the track mode. This causes the information current Im to be adjusted by error amp A1, which now has an input error current of If2−It2, until the optical power output of SLD2 attains the predetermined value defining its second state. The current Ims now mirrors the value of Im as it flows through SDL2. The current Imt−Ims is formed via switch S7 being closed and input to error amplifier A3. Error amplifier A3 amplifies the error current and drives track and hold circuit T/H3. The output of track and hold circuit T/H3 adjusts the current source Ib2 such that Imt−Ims=0, which is the condition that causes Im to be substantially the same value as when it was flowing through device SLD1. Track and hold circuit T/H3 is now placed in hold mode until the next calibration cycle. This ends this phase of adjustment and the calibration process.

The result of this process of adjusting the bias current Ib2 accomplishes two desired effects. Firstly the value of Im is made to be substantially the same value when flowing through SLD2 as when flowing through SLD1. Secondly the contrast ratio is maintained substantially constant by adjusting the bias current Ib1 to produce the low predetermined optical power output defining the first state of SLD1.

The calibration cycle is periodically repeated to adjust the circuit for changes in the transfer characteristics of SLD1 and SLD2 due to temperature and age.

Having described in detail the preferred embodiment of the invention, it will now be apparent to those skilled in the art that numerous modifications can be made therein without departing from the scope of the invention as defined in the following claims.

What I claim is:

1. A method for driving a semiconductor laser device between first and second states comprising the steps of:
   (a) driving the semiconductor laser device with a bias current which produces a predetermined optical power output that defines said first state;
   (b) driving said semiconductor laser device at a higher current produced by the combination of said bias current and an information current, said higher current producing another predetermined optical power output that defines said second state;
   (c) producing a transition from said second state to said first state by steering the information current to a current sink having substantially the same switching speed and voltage versus current terminal characteristics as said semiconductor laser device; and,
   (d) producing a transition from said first state to said second state by steering said information current to said semiconductor laser device.

2. The method of claim 1 further comprising the step of repeating steps (c) and (d) in response to an information signal.

3. The method of claim 2 wherein said information signal represents a halftone image.

4. The method of claim 2 wherein said information signal represents a contone image.

5. The method of claim 2 wherein the optical power output of said second state of said semiconductor laser device is constant.

6. The method of claim 2 wherein the optical power output of said second state of said semiconductor laser device is variable.

7. The method of claim 2 wherein the optical power output of said second state of said semiconductor laser device is variable and wherein the variation represents a contone image.

8. The method of claim 1 wherein said current sink has a bias current that maintains said information current substantially constant during the transition of step (c) and during the transition of step (d).

9. The method of claim 1 wherein said semiconductor laser device is a semiconductor laser diode.

10. The method of claim 1 wherein said current sink is a semiconductor laser diode.

11. The method of claim 2 wherein said information signal represents an image to be recorded on a recording media wherein said optical power output that defines said first state is below an image recording threshold of said recording media and said optical power output that defines said second state is above said image recording threshold.

12. The method of claim 1 wherein said information current is controlled by a feedback signal causing adjustment to said information current such that said second state optical power output level of said semiconductor laser device remains substantially constant.

13. The method of claim 12 wherein said feedback signal is produced by a semiconductor photodiode having a portion of said optical power output of said semiconductor laser device focused thereon to generate a current flow in said photodiode which is proportional to said optical power output of said semiconductor laser device.

14. The method of claim 13 wherein said photodiode is internal to said semiconductor laser device.

15. The method of claim 13 wherein said photodiode is external to said semiconductor laser device and a portion of said optical power output of said semiconductor laser device is focused onto said photodiode by an optical system.

16. The method of claim 13 wherein the relationship of said current flow versus said optical power output of said semiconductor laser device is stable over a range of operating temperature.

17. The method of claim 1 wherein said information current and said predetermined optical power output are closed loop controlled by the steps of:
   (a) generating a first feedback signal proportional to the optical power output of said semiconductor laser device,
   b) generating a first reference signal having a value equal to the value of said first feedback signal which occurs at said predetermined optical power output level of said second state of said semiconductor laser device,
   (c) generating a second feedback signal proportional to the optical power output of said current sink,
   (d) generating a second reference signal having a value equal to the value of said second feedback signal which occurs at the predetermined optical power output level of a second state of said current sink,
   (e) adjusting said information current for said first semiconductor laser device in response to the difference between said first feedback signal and said first reference signal such that said second state of said semiconductor laser device produces said predetermined optical power output,
   (f) adjusting said information current for said current sink in response to the difference between said second feedback signal and said second reference signal such that said second state of said current sink produces said predetermined optical power output.

18. The method of claim 2 further comprising the steps of:
   (a) adjusting said bias current of said semiconductor laser device such that said semiconductor device produces said predetermined optical power output of said first state;
   (b) adjusting said information current such that the sum of said information current and said bias current causes said semiconductor laser device to emit said predetermined optical power output of said second state; and,
   (c) adjusting a bias current of said current sink such that the sum of said bias current and said information current causes said current sink to emit said predetermined optical power output for said second state, and causes said information current to have substantially the same value as in step (b).

19. An apparatus for driving a semiconductor laser device between first and second states, said method comprising:
   (a) means for driving the semiconductor laser device with a bias current which produces a predetermined optical power output that defines said first state;
   (b) means for driving said semiconductor laser device at a higher current produced by the combination of said bias current and an information current, said higher current producing another predetermined optical power output that defines said second state;
   (c) means for producing a transition from said second state to said to said first state by steering said information current to a current sink having substantially the same switching speed and voltage versus current terminal characteristics as said semiconductor laser device; and,
   (d) means for producing a transition from said first state to said second state by steering said information current to said semiconductor laser device.

20. The apparatus of claim 19 wherein said means for producing said transition from said second state to said first state and said means for producing said transition from said first state to said second state are responsive to an information signal.

21. The apparatus of claim 20 wherein said information signal represents a halftone image.

22. The apparatus of claim 20 wherein said information signal represents a contone image.

23. The apparatus of claim 20 wherein the optical power output of said second state of said semiconductor laser device is constant.

24. The apparatus of claim 20 wherein the optical power output of said second state of said semiconductor laser device is variable.

25. The apparatus of claim 20 wherein the optical power output of said second state of said semiconductor laser device is variable and wherein the variation represents a contone image.

26. The apparatus of claim 19 wherein said current sink has a bias current that maintains said information current substantially constant during the transition from said second state to said first state and the transition from said first state to said second state.

27. The apparatus of claim 19 wherein said semiconductor laser device is a semiconductor laser diode.

28. The apparatus of claim 19 wherein said current sink is a semiconductor laser diode.

29. The apparatus of claim 20 wherein said information signal represents an image to be recorded on a recording media wherein said optical power output that defines said first state is below an image recording threshold of said recording media and said optical power output that defines said second state is above said image recording threshold.

30. The apparatus of claim 19 wherein said second current is controlled by a feedback means for adjusting said second current such that said second state optical power output level of said semiconductor laser device remains substantially constant.

31. The apparatus of claim 30 wherein said feedback means is a semiconductor photodiode with a portion of said optical power output of said semiconductor laser device focused onto said photodiode which causes a current flow in said photodiode which is proportional to said optical power output of said semiconductor laser device.

32. The apparatus of claim 31 wherein said photodiode is internal to said semiconductor laser device.

33. The apparatus of claim 31 wherein said photodiode is external to said semiconductor laser device and a portion of said optical power output of said semiconductor laser device is focused onto said photodiode by an optical system.

34. The apparatus of claim 31 wherein the relationship of said current flow versus said optical power output of said semiconductor laser device is stable over a range of operating temperature.

35. The apparatus of claim 19 wherein said information current and said predetermined optical power output are controlled by a closed loop system comprising:

(a) means for generating a first feedback signal proportional to the optical power output of said semiconductor laser device;

(b) means for generating a first reference signal having a value equal to the value of said first feedback signal which occurs at said predetermined optical power output level of said second state of said semiconductor laser device;

(c) means for generating a second feedback signal proportional to the optical power output of said current sink;

(d) means for generating a second reference signal having a value equal to the value of said second feedback signal which occurs at the predetermined optical power output level of a second state of said current sink;

(e) means responsive to the difference between said first feedback signal and said first reference signal for adjusting said information current for said semiconductor laser device such that said second state of said semiconductor laser device produces said predetermined optical power output; and, (f) means responsive to the difference between said second feedback signal and said second reference signal for adjusting said information current for said current sink such that said second state of said current sink produces said predetermined optical power output.

36. The apparatus of claim 20 further comprising:

(a) means for adjusting said bias current of said semiconductor laser device such that said semiconductor laser device produces said predetermined optical power output of said first state;

(b) means for adjusting said information current such that the sum of said second current and said bias current causes said semiconductor laser device to emit said predetermined optical power output of said second state; and, (c) means for adjusting a bias current of said current sink such that the sum of said bias current and said information current causes said current sink to emit said predetermined optical power output for said second state, and causes said information current to have substantially the same value as said information current that when added to said bias current of said semiconductor laser device caused said semiconductor laser device to emit its' said predetermined optical power output of its' said second state.

\* \* \* \* \*